United States Patent [19]

Andrews et al.

[11] Patent Number: 4,845,335
[45] Date of Patent: Jul. 4, 1989

[54] LASER BONDING APPARATUS AND METHOD

[75] Inventors: Daniel M. Andrews, Austin; Philip J. Spletter, Cedar Park; Richard L. Simmons, Jonestown, all of Tex.

[73] Assignee: Microelectronics and Computer Technology Corporation, Austin, Tex.

[21] Appl. No.: 149,449

[22] Filed: Jan. 28, 1988

[51] Int. Cl.$^4$ .............................................. B23K 26/00
[52] U.S. Cl. ............................ 219/121.63; 219/121.84
[58] Field of Search ....................... 219/121.63, 121.64, 219/121.84, 121.82, 121.74, 121.77; 361/400, 405

[56] References Cited

U.S. PATENT DOCUMENTS

| | | | |
|---|---|---|---|
| 4,320,281 | 3/1982 | Cruickshank et al. | 219/121.64 |
| 4,330,699 | 5/1982 | Farrow | 219/121.64 |
| 4,341,942 | 7/1982 | Chaudhari et al. | |
| 4,394,711 | 7/1983 | Conley | 361/400 X |
| 4,404,453 | 9/1983 | Gotman | 219/121.64 |
| 4,471,204 | 9/1984 | Takafuji et al. | 219/121.64 |
| 4,534,811 | 8/1985 | Ainslie et al. | 219/121.6 X |
| 4,587,395 | 5/1986 | Oakley et al. | 219/121.64 |
| 4,691,092 | 9/1987 | Verburgh et al. | 219/121.64 |
| 4,697,061 | 9/1987 | Spater et al. | 219/121.64 |
| 4,727,246 | 2/1988 | Hara et al. | 361/401 X |

OTHER PUBLICATIONS

"Laser Microsoldering", by F. Burns and C. Zyetz, pp. 115–124.
Avt. Svarka, 1978, No. 5, pp. 20–21, "The Pulsed Laser Welding of Conductors to Films in the Manufacturing of Micro-Devices", P. F. Avramchenko et al.
IEEE, 1986, "Yag Laser Soldering System for Fine Pitch Quad Flat Package (QFP)", Keiji Okino, et al., pp. 152–156.
Institute for Interconnecting and Packaging Electronic Circuits, "Application of Laser Microsoldering to Printed Wiring Assemblies", by Earl F. Lish, Apr. 1985.

*Primary Examiner*—C. L. Albritton
*Attorney, Agent, or Firm*—Fulbright & Jaworski

[57] ABSTRACT

A method and apparatus of bonding two electrical members together uses a pulsed YAG laser. Various apparatus and methods may be used to hold the electrical members in contact under pressure to insure uniform bonding. Automation production equipment provides for the automatic bonding of the flat electrical leads of a TAB tape to the flat electrical bumps on a plurality of integrated circuit dies.

9 Claims, 8 Drawing Sheets

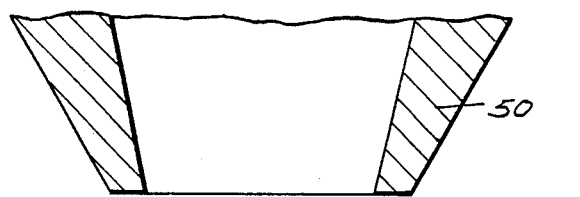
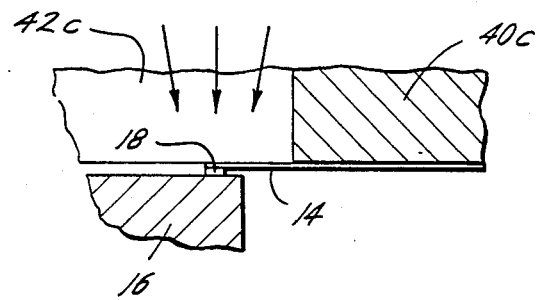
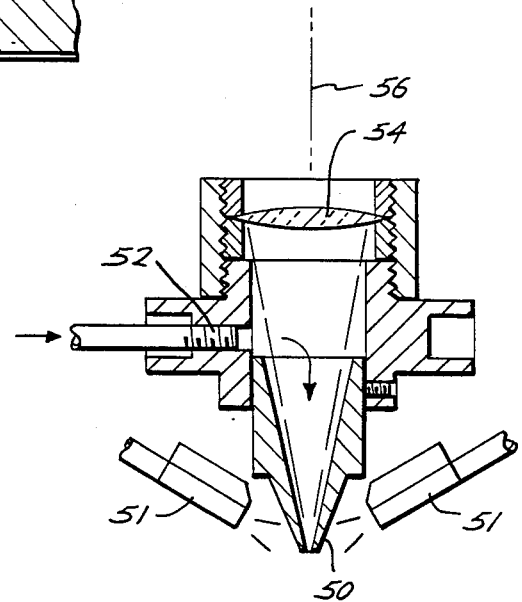
Fig. 8
Fig. 9
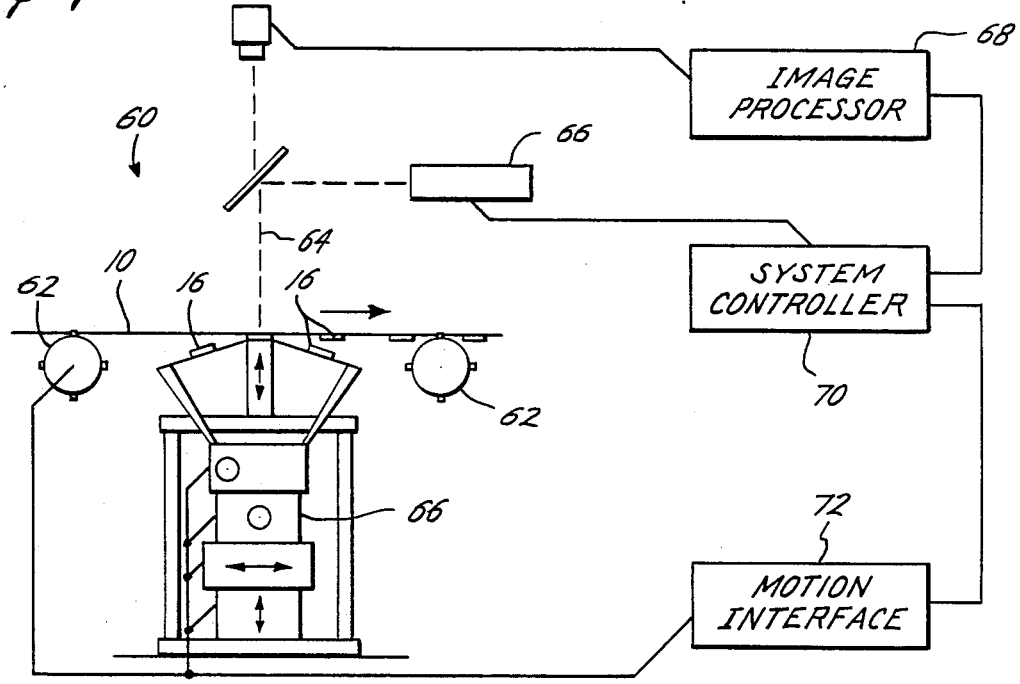
Fig. 10

LASER BONDING APPARATUS AND METHOD

BACKGROUND OF THE INVENTION

The present invention is directed to using laser bonding to connect two electrical members together. In particular, the present invention is directed to the inner lead bonding of a tape automated bonding tape (TAB) to the electrical bumps on an integrated circuit die, such as semi-conductors. Thermal compression bonding, the current industry standard for inner lead bonding, uses 15,000 psi pressures and 400° C. temperatures which would have a damaging effect if leads were bonded to bonding pads or bumps coated over semi-conductor structures.

One of the features of the present invention is to provide the most appropriate laser technology for bonding.

One of the most important problems in laser bonding is holding the lead in proper contact with the electrical bump for having an interface which will provide intimate contact to provide a good bond without voids. The present invention is directed to various structures and methods for holding the electrical leads in contact with the bumps to insure proper contact for bonding.

Another feature of the present invention is the use of particular metal combinations for the electrical members to be bonded together which optimize the adhesion between the members and produce stronger bonds.

Another feature of the invention is the provision of a production apparatus and method for automatically bonding a plurality of integrated circuit dies to a TAB tape by laser bonding.

SUMMARY

The present invention is directed to a method of bonding the electrical leads of a TAB tape to contacts and includes placing the leads and contacts in intimate contact with each other and bonding the leads and contacts together at the interfaces with a laser such as a pulsed YAG laser.

Another object of the present invention is wherein the lead is prebent to provide a resilient set and is thereafter pressed into a cantilever spring engagement with the contact.

Still a further object of the present invention is wherein the lead is brought into ultimate contact with the contact by directing a stream of gas against the lead to hold the lead in engagement with the contact. Preferably, the gas is nitrogen and preferably the stream of gas is directed coaxially with the laser beam.

Still a further object is the provision of coatings to the electrical members which have the property of being easily coupled to the laser radiation and which has a low melting point.

In one embodiment the lead is of copper and is coated with tin and the contact is gold. The tin coating is at least three micro-inches thick, and for providing a longer shelf life the tin coating is at least 12 micro-inches thick. Other coatings may be indium and gallium and mixtures of suitable coatings.

Still a further object of the present invention is the provision of a method of bonding the flat electrical leads of a TAB tape to flat electrical bumps on an integrated circuit die by aligning the bumps and leads with each other with the tape positioned above the integrated circuit. The flat leads are held in ultimate contact with the flat electrical bumps to form a flat interface and the leads and bumps are bonded together at the interface with a pulsed YAG laser. The leads may be brought into an intimate contact with the bumps by directing a stream of gas against the leads, using an overlay fixture which includes a flat surface engaging a predeformed lead which is pressed into a spring engagement with the bump, or uses an overlay fixture which includes a lip engaging the lead at a position spaced from the lead end for pressing the lead into a spring engagement with the bump or any other method that produces (intimate) contact.

Yet a still further object of the present invention is the provision of an automatic bonder for bonding the flat electrical leads of a tape to flat electrical bumps on a plurality of integrated circuit dies which includes a laser, means for moving the tape transverse to the laser beam, means for holding a plurality of integrated circuit dies adjacent and below the tape, means for moving the die and tape towards each other, means for aligning the leads on the tape with the bumps on the die, and means for holding the leads in contact with the aligned bumps.

Yet a still further object of the present invention is wherein the plurality of integrated circuit dies includes a silicon wafer positioned on a resilient support on which the wafer has been cut to form a plurality of dies, with or without means for stretching the support for separating the integrated circuit dies from each other for ease of handling the individual dies. The stretching means may include means for holding the periphery of the resilient support outside of the wafer, and a ring movable against the support at a location between the holding means and the outside of the wafer.

Another object of the present invention is wherein first and second electrical members are bonded together by a YAG laser in which the diameter of the laser beam is substantially 0.002 inches, has an energy output of approximately $\frac{1}{4}$ to $\frac{1}{2}$ of a joule in a time of approximately one millisecond.

Other and further objects, features and advantages will be apparent from the following description of presently preferred embodiments of the invention, given for the purpose of disclosure, and taken in conjunction with the accompanying drawings.

BRIEF DESCRIPTION OF THE DRAWINGS

FIG. 8 is an enlarged fragmentary elevational view illustrating another embodiment of placing an electrical lead in pressurized contact with an electrical bump, FIG. 9 is an elevational detailed view showing a gas nozzle coaxially with a laser beam for pressurizing a lead into contact with a bump, FIG. 10 is an elevational schematic of an automated laser bonding system.

DESCRIPTION OF THE PREFERRED EMBODIMENT

While the present invention will be described, for purposes of illustration only, of the laser bonding of tape automated bonding and TAB lead frames to integrated circuits, the present method and apparatus for laser bonding is applicable to bonding other types of electrical members to each other.

Figure 1:
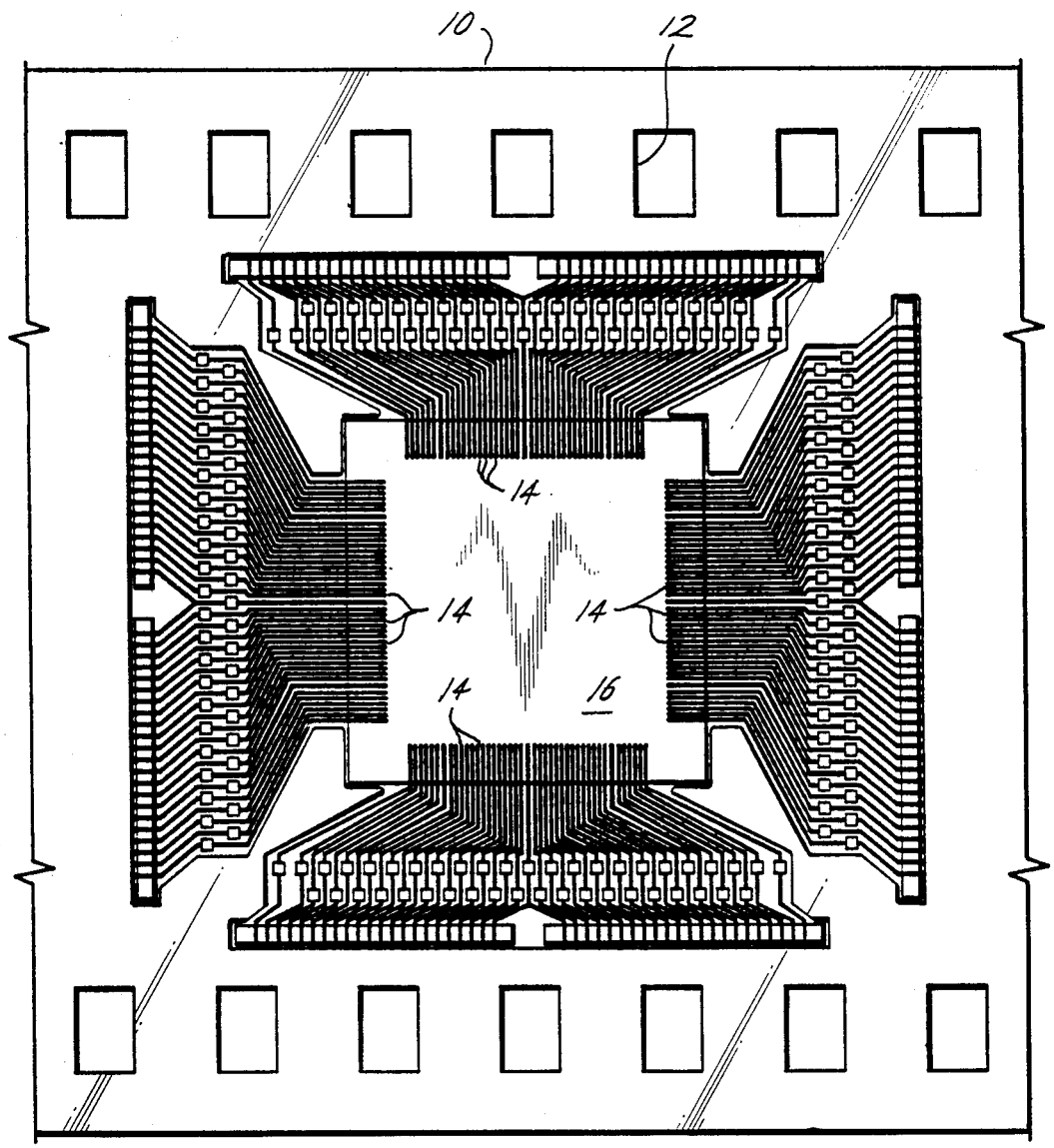
FIG. 1 is a fragmentary enlarged elevational view of a TAB tape with an integrated circuit die in place for bonding.

Referring now to the drawings, and particularly to FIG. 1, the reference numeral 10 generally indicates a portion of a tape automated bonding tape (TAB) having the usual sprocket holes 12 and plurality of inner leads 14 for bonding to an integrated circuit die 16 having active semi-conductor circuitry.

Current industry standards for TAB inner lead bonding uses conventional thermocompression bonding with high pressures and temperatures (currently 15,000 psi and 400 C.) which is acceptable for bonding leads located over bare silicon. Conventional thermocompression bonding is not suitable for bonding over semi-conductor structures. However, it would be advantageous to locate the bonding bumps over active circuitry to allow reduction in the cost of the assembled integrated circuits and improve performance by reducing signal path lengths. Furthermore, the yield and reliability of bonds over bare silicon can be increased by greatly reducing heat and pressure.

Figure 3:
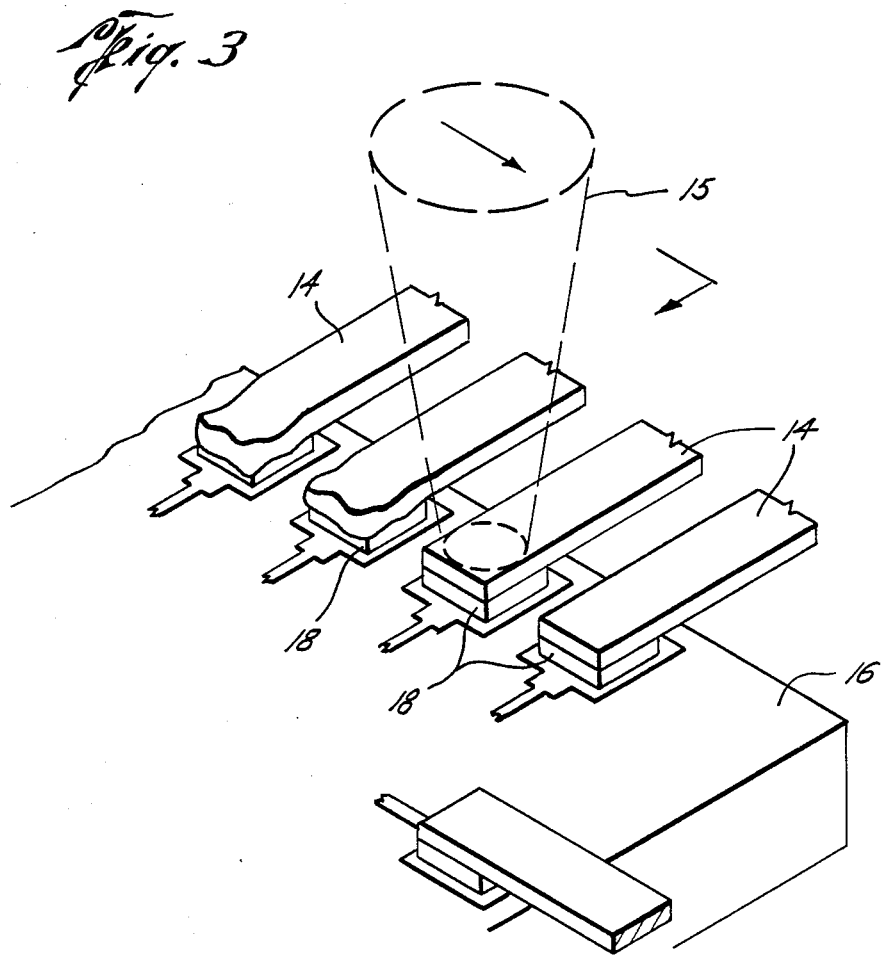
FIG. 3 is a fragmentary perspective view of a laser beam bonding the inner leads of a TAB tape to the bumps on an integrated circuit die.

Thus, the present invention is advantageous by using laser bonding, where a localized, concentrated heating source, a laser beam 15, is used to bond the inner leads 14 to the bumps 18 on an integrated circuit die 16, as shown in FIG. 3. In a typical lead-bump connection, the bumps are square bumps 25 microns thick with each side approximately 4.4 mils long. The leads 14 are 1.3 mils thick and 3 mils wide.

The first problem considered is which of the available laser technologies is the most appropriate for bonding the leads 14 to the bumps 18.

$CO_2$ lasers, which have a wavelengths of 10.6 microns, were considered. However, such laser energy is better absorbed by a heat transfer medium such as flux than the metal electrical contacts 14 and 18. Also, due to its longer wavelength, a $CO_2$ laser cannot be focused to a small enough spot for bonding the lead 14 and bump 18 and were therefore excluded from consideration.

Since the integrated circuit 16 uses aluminum as a conductor material, and the base material for the leads 14 and bumps 18 are copper and gold, lasers in the spectrum between 0.2 and 0.3 microns wavelength were considered. This is a desirable situation as energy at these wavelengths is well coupled to the leads 14 and bumps 18 while it is reflected by the underlying aluminum structures. In this spectrum, excimer lasers were tested. However, it was found that their radiation was so well coupled that it ablated the molecular bonds rather than merely vibrating them to cause melting and therefore these lasers were rejected.

YAG lasers are solid state lasers with an output that is either continuous wave (CW), shuttered with an acoustical-optic or electro-optic device (Q-switch), or pulsed. They have a wavelength of 1.064 microns. The laser output power as a function of time is different for each of the YAG lasers. And it was concluded that these differences have a profound effect upon the suitability of the laser for bonding. A Q-switch laser permits lasing only when the Q-switch is open and there is a power spike of several nanoseconds duration at the beginning of each pulse which is capable of drilling a deep small diameter hole in the bond site. The CW laser took considerably more energy to melt the bumps than the Q-switch laser.

Figure 4:
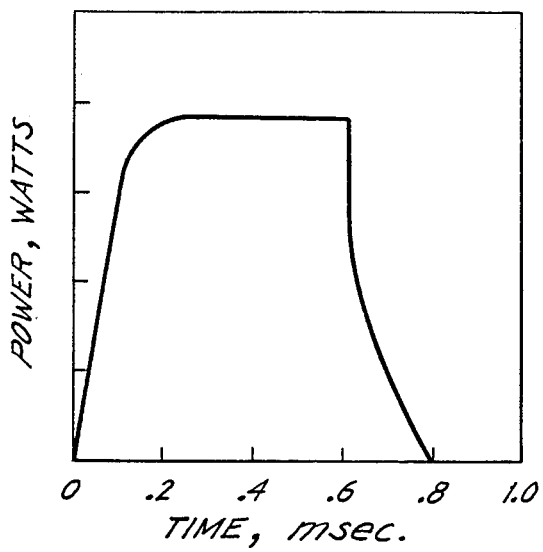
FIG. 4 is a graph showing the wave form of a pulsed YAG laser.

The best test results have been obtained using the pulsed YAG laser. The power versus time curve for a pulsed laser is shown in FIG. 4. In a pulsed laser the flashed lamps are turned on and off for each pulse. As a result, there is an exponential increase in power output until a maximum level is reached at which point the power exponentially decreases. With a pulsed laser, the metals to be bonded are heated to a maximum temperature at which time the energy input exponentially decreases. The pulsed laser provides a higher power level at the middle of the pulse than the Q-switch laser. However, the peak power is orders of magnitude less than the spike at the beginning of the Q-switch pulse. This power preheats the bond site and provides the bond site with the most power when it can use it most efficiently. It also provides decreasing power which should tend to allow less internal stress buildup than the instantaneous drop-off of energy that is characteristic of the Q-switch or CW laser. It was found that a 50 watt pulse YAG laser made by Carl Haas GmbH Co. was satisfactory.

Figure 2:
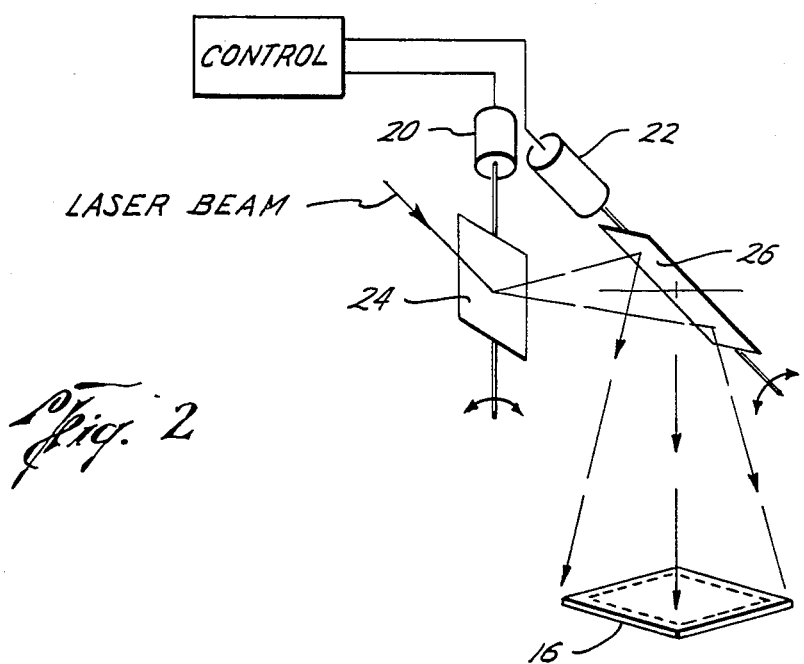
FIG. 2 is a schematic perspective view of one method of moving a laser beam for bonding a plurality of bonds.

The next problem was how to deliver the laser beam 15 in FIG. 3 to the plurality of bond sites between each of the leads 14 and the bumps 18 around the perimeter of the integrated circuit die 16. In order to provide a production oriented system, it is more feasible to have a system with a moving laser beam instead of moving the tape 10 and die 16. In order to prove the feasibility of laser bonding, the optical arm beam positioning system that is on an ESI model 44 laser trimmer, was selected. However, for higher bonding rates such as would be necessary for a production bonder, a galvanometric laser beam steering system is desirable. With this system the parts, including the die 16, as best seen in FIG. 2, remains stationary while galvanometers 20 and 22 in the X and Y axis, respectively, rotate mirrors 24 and 26, respectively, to direct the laser beam to the desired location.

Figure 5:
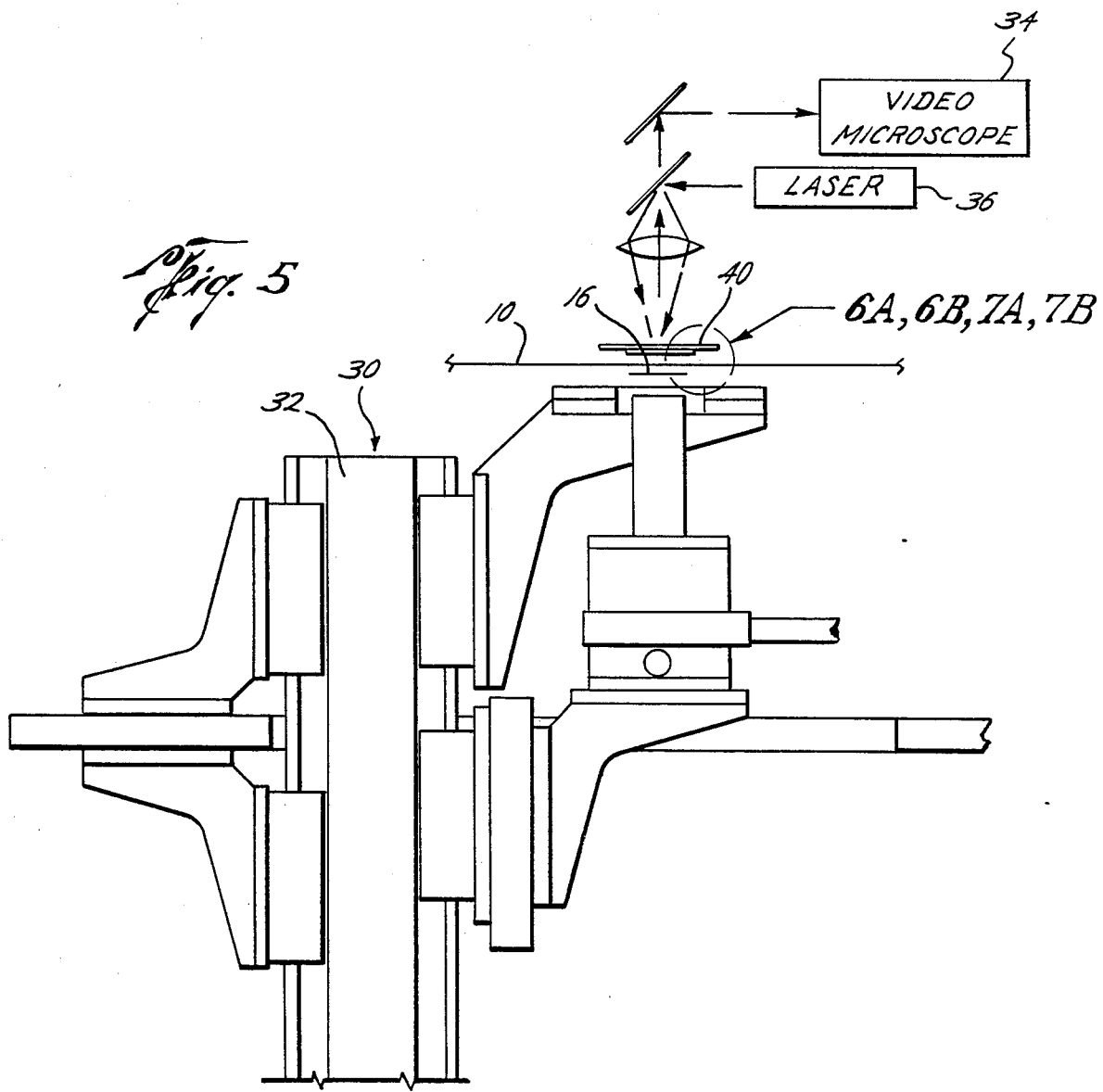
FIG. 5 is an elevational view, partly schematic, illustrating one structure for bonding a die to a tape.

Experimental bonding showed the importance of holding the leads 14 in uniform, intimate contact with the bumps 18. Referring to FIG. 5, a test setup is shown for determining laser bonding feasibility using a single die 16 for bonding to the tape 10. The test fixture 30 used an optical rail 32 on which the mount the apparatus necessary to present the die 16 and tape 10 for alignment. A video microscope 34 allowed an operator to view the bond site coaxially with the path of the laser 36. The fixturing allowed the die 16 to be moved relative to the tape 10 in four degrees of freedom (X, Y, Z and theta (about Z)) support 38. The tape 10 and die 16 are shown out of position for ease of illustration of their relative positions.

While it is a relatively easy task to position the bumps 18 in alignment with the tape leads 14, it is a bigger problem to provide a uniform intimate repeatable interface contact between the leads 14 and the bumps 18.

Usually the TAB tape 10 will not naturally lie flat due to reasons such as its thin cross section, interior lead detail, and residual stresses. Therefore, an overlay fixture generally indicated by the reference numeral 40 is provided for engaging the top of the tape 10. The overlay 40 aligns the top of the tape 10. However, merely placing a flat plate against the flat top of the leads 14 does not always bring the ends of the leads 14 into a good contact with the bumps 18.

Figure 6A:
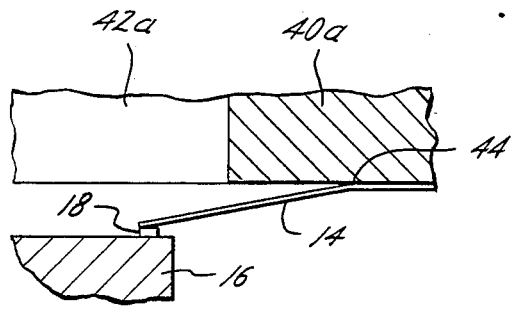
FIGS. 6A and 6B are enlarged sequence fragmentary elevational views showing one structure for placing a lead in pressurized contact with a bump.
Figure 6B:
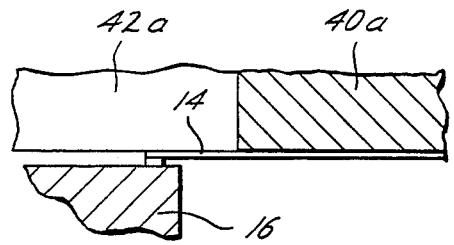

Referring now to FIGS. 6A and 6B, an overlay fixture 40a is seen having an opening 42a for the passage of the laser beam and is positioned above the lead 14 which is to be mated with a bump 18 on the integrated circuit die 16. In this embodiment, as best seen in FIG. 6A, the lead 14 is preformed or deformed at a point 44 to have a downward set, for example, 10° from its original straight position. The overlay plate or fixture 40a is positioned relative to the lead 14 to engage the point of deformation 44. As shown in FIG. 6B, the die 16 is then moved relative to the fixture 40a so that the bump 18 makes contact with the end of the lead 14 by traveling through the distance to which the lead 14 was preformed. This travel causes a cantilevered spring action of the lead 14 to provide a uniform contact between the lead 14 and the bump 18. While this lead preforming is a successful method of achieving satisfactory lead/bump contact, there are also certain disadvantages. One possibility is the potential problem that the leads 14 may be moved in their coordinate positions by preforming. Another problem is the requirement of the additional preforming step.

Figure 7A:
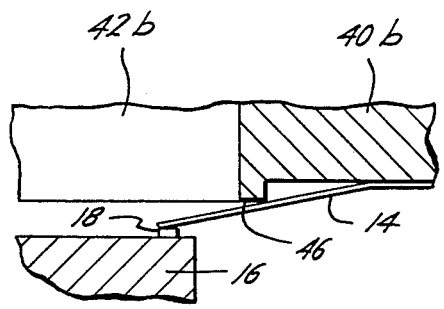
FIGS. 7A and 7B are enlarged sequence fragmentary elevational views showing another structure for placing a lead in pressurized contact with an electrical bump.
Figure 7B:
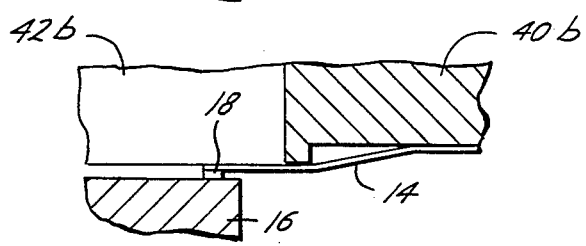

Referring to FIGS. 7A and 7B, another type of overlay fixture 40b is shown in which the overlay 40b includes a ridge or lip 46 on the underside of the fixture 40b which avoids the problem of preforming the lead 14. As the die 16 and fixture 40b are moved towards each other, as best seen in FIG. 7A, the ridge or lip 46 deflects the lead 14 downwardly, such as 10°. As best seen in FIG. 7B as the die 16 continues moving towards the fixture 40b the free end of the lead 14 is springloaded against the bump 18 to provide interface contact. The structure of FIGS. 7A and 7B eliminates the preprocessing step of preforming the leads 14.

Referring now to FIG. 8, a third method of obtaining a contact between the leads 14 and bumps 18 is shown, in this case an overlay fixture 40c. A nozzle 50 is provided to direct gas against the lead 14 thereby applying pressure against the back of the lead 14 to bring it into contact with the bump 18. Preferably, as best seen in FIG. 9, the nozzle 50 is located coaxially with the laser beam 56. An input gas port 52 is provided downstream of the last optical lens 54 of the laser system whereby both gas and the laser beam exit through the nozzle 50. Experimental results indicate that the orifice of the nozzle should be spaced approximately 0.010 inches to 0.020 inches above the top of the lead 14. It has also been observed that gas pressures in the order of 20 psig at a flow rate of 4 scfh resulted in a sufficient contact to provide the necessary pressure for good bonding. Preferably, the gas is nitrogen as it reduces the possibility of creating static electricity. Fiber optic lights 51 are shown for illuminating the site.

Another factor to be considered in the bonding of the leads 14 to the bumps 18 is the types of materials used. Experiments with a number of lead finishes and bump metallurgies have been performed. It has been found that it is desirable to provide coatings which couple well to wavelength of the laser used and which have a lower melting point than the melting point of the leads 14 and bumps 18. The highest bonding yields have been obtained when copper leads coated with nominal 25 microinches of emersion tin were bonded to gold bumps. A cross-sectional examination of the bonds indicated that there is a void-free, uniform interface between the lead and the bump. An electron microscope scan taken along the interface between the lead and the bump indicate regions of constant composition indicating the presence of alloy compounds.

The line scans reveal that the principal alloy that is formed during bonding contains 20% copper and 80% gold, which is the lowest melting point Cu/Au solid solution. No significant amounts of tin are found in the bond interface. However, tin seem to aid energy coupling (tin is a very good absorber of YAG radiation) and wetting without forming brittle interim metallic compounds. This situation appears to be unique to laser bonding.

When the copper in the lead of a bond cross section is preferentially etched, the top of the copper lead, where the laser beam was focused is completely melted and has alloyed with the other materials. Below the melted region there is a region where the copper plating has been heated enough to recrystallize the structures that were formed during electro-deposition of the copper. The third region of the lead is adjacent to the bond interface. No melting of copper has occurred, and the grain structure of the region is exactly as it was when the copper was plated. The cross section shows a metallurigical bond formation that is unique to laser bonding. Normally, when tin/lead solder is used to join two metals, the solder is the only material that is melted. The molten tin desolves the materials that are joined. If gold is one of the materials to be joined, brittle gold/tin intermetallic compounds are formed. However, in the case of laser bonding tin plated copper leads to gold bumps, the tin easily absorbs the laser energy and due to its low vapor pressure, does not boil away. Rather, it promotes melting on the top of the copper lead. The molten tin and copper flows over the sides of the lead then between the lead and the bump. The tin in the reaction zone produces intermediate phases with copper and gold which melt below the melting point of the elemental metals. In this way, atomic copper and gold are introduced into a liquid environment sooner in the pulsed/temperature cycle and full alloying is accelerated and enhanced. The molten material in the bond interface also promotes conductive heat transfer so that sufficient laser energy is coupled to the lead and the bump so that a sound metallurgical bond is formed. Finally, as solidification succeeds, the tin is driven out of the copper/gold solution since the solubility of tin in molten copper and gold is so low, thus preventing the formation of brittle intermetalic compounds in the body of the bond.

The amount of free tin on the lead also has a direct bearing on the bondability of the lead. When tin is plated on the leads, initially all of the tin is pure, free tin. Over time, the free tin reacts in the solid state with the copper to form $Cu_6/Sn_3$ compound. The longer the tape sits, the thicker the copper/tin compound and the thinner the free tin layer becomes. While the copper/tin compounds have a much higher melting point than free tin, it is still considerably lower than the melting point of elemental gold and copper so that it also contributes to the bonding phenomenon described above. However, if the free tin layer is too thin, not enough tin is present to absorb the radiation and initiate the melting-/heat transfer process. Experience and limited experiments show that at least three microinches of free tin is required to achieve satisfactory laser bonds to gold bumps. Experience has also shown that if the leads are plated with at least twelve micro-inches of electroless tin the tapes can be stored in a dry box for over two months before a detrimental amount of copper/tin compound is formed.

The fact that the bonded lead has three distinct regions of thermal reaction within a height of 1.4 mils indicates that there is a very steep thermal gradient. The temperature of semi-conductor structures below the bond site have been experimentally determined to be in the neighborhood of 100° C. It has been determined that by using laser bonding, it is feasible to bond leads to bumps on semi-conductor structures.

Most of the bonding experiments were performed using tin plated copper leads over gold bumps. However, experiments with other material combinations have also been performed. For these experiments, leads were either bare copper or copper electroplated with tin, silver, gold, zinc, nickle or indium. All leads were either bonded to either gold or copper bumps. With the exception of zinc, all of the lead materials bonded to bumps made from other materials. Zinc has high enough vapor pressure that it boils away before it can flow between the lead and bump to promote heat transfer. Indium, on the other hand, like tin, has a low vapor pressure and a low melting point. Bonds that were made with indium plated leads are very similar in appearance to those made with tin plating. Other suitable coatings may include gallium and mixtures of suitable coatings.

After the laser bonding process developed were consistent, high yield bonds were made, samples were bonded and subjected to environmental testing. Eight parts were bonded. Thirty-two leads, the first and last four on each side, were tested to obtain the pull strengths prior to environmental testing. Next, two samples were subjected to one of the following tests: high temperature storage (500 hours at 150° C. PER MIL-STD-883C.), 85/85 (500 hours at 85° C. and 85% R.H.), air-to-air thermal shock (1000 cycles between minus 65° C. and 150° C. PER MIL-STD-883C.) and liquid-to-liquid temperature shock (1000 cycles between minus 55° C. and 125° PER MIL-STD-883C.). The parts were removed from the environments at regular intervals and pulled tested. Throughout the test, all pull tests exceeded 50 grams.

While the prototype system used for feasibility demonstration, shown in FIG. 5, is capable of making 5 to 6 bonds per second, higher bonding rates are desirable for use in a production environment and bonding rates in excess of 200 bonds per second are achievable with equipment such as is shown in FIG. 5. Referring now to FIG. 10 a schematic of a semi-automatic bonder generally indicated by the reference numeral 60 is shown in which a tape 10 is movable horizontally by suitable sprockets 62 across a laser beam 64 from a laser 66. Integrated circuit dies 16 are positioned under the tape 10 and are moved into alignment with the tape 10 in the X, Y, Z and theta directions by a support 66. Image processor 68 measures when alignment is accomplished. A system controller 70 actuates the laser 66 and a motion interface 72 to control the sprockets 62 and the support 66 for operating the apparatus 60.

Figure 11:
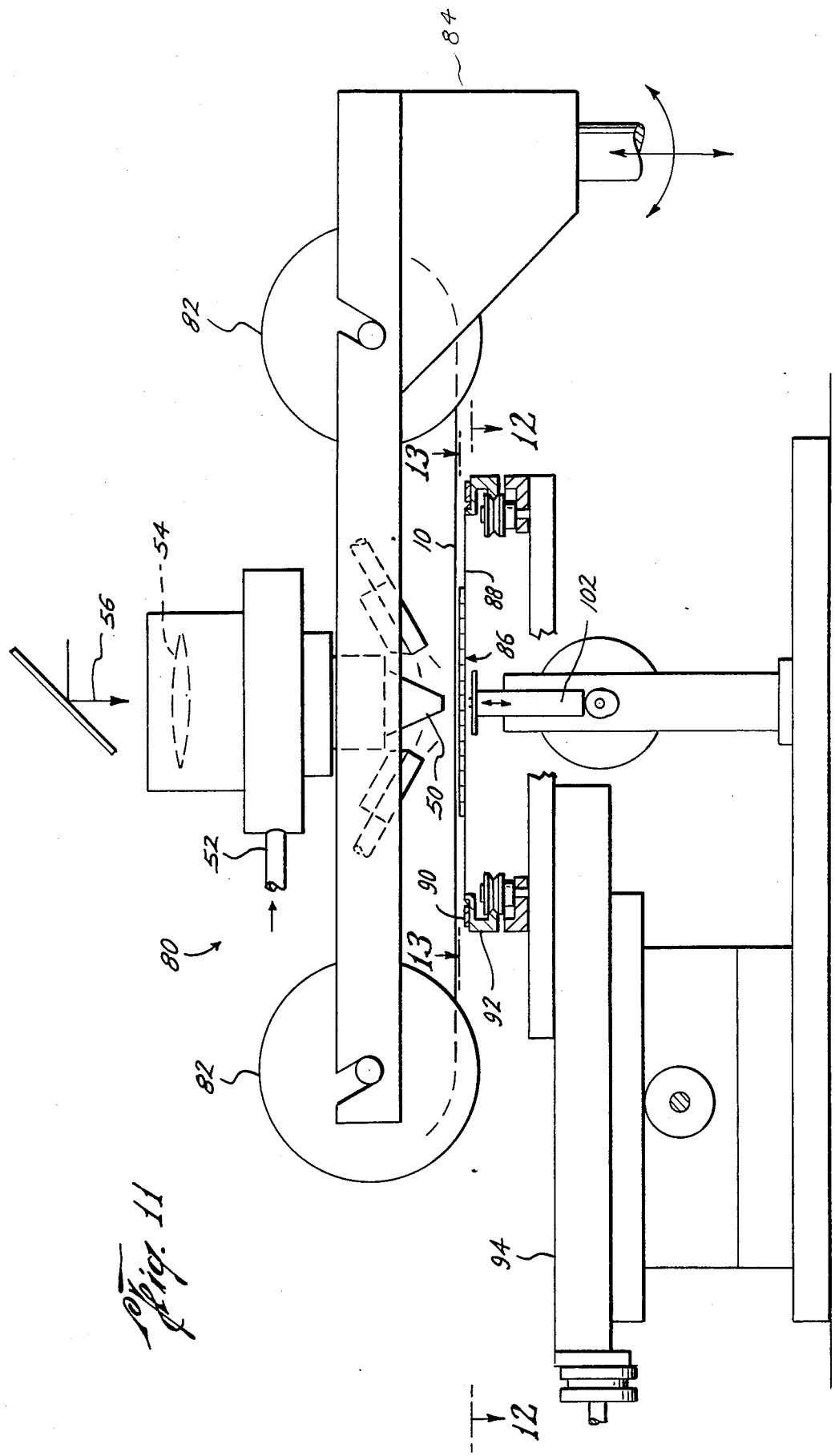
FIG. 11 is a fragmentary elevational schematic view of another automated laser bonding apparatus.
Figure 12:
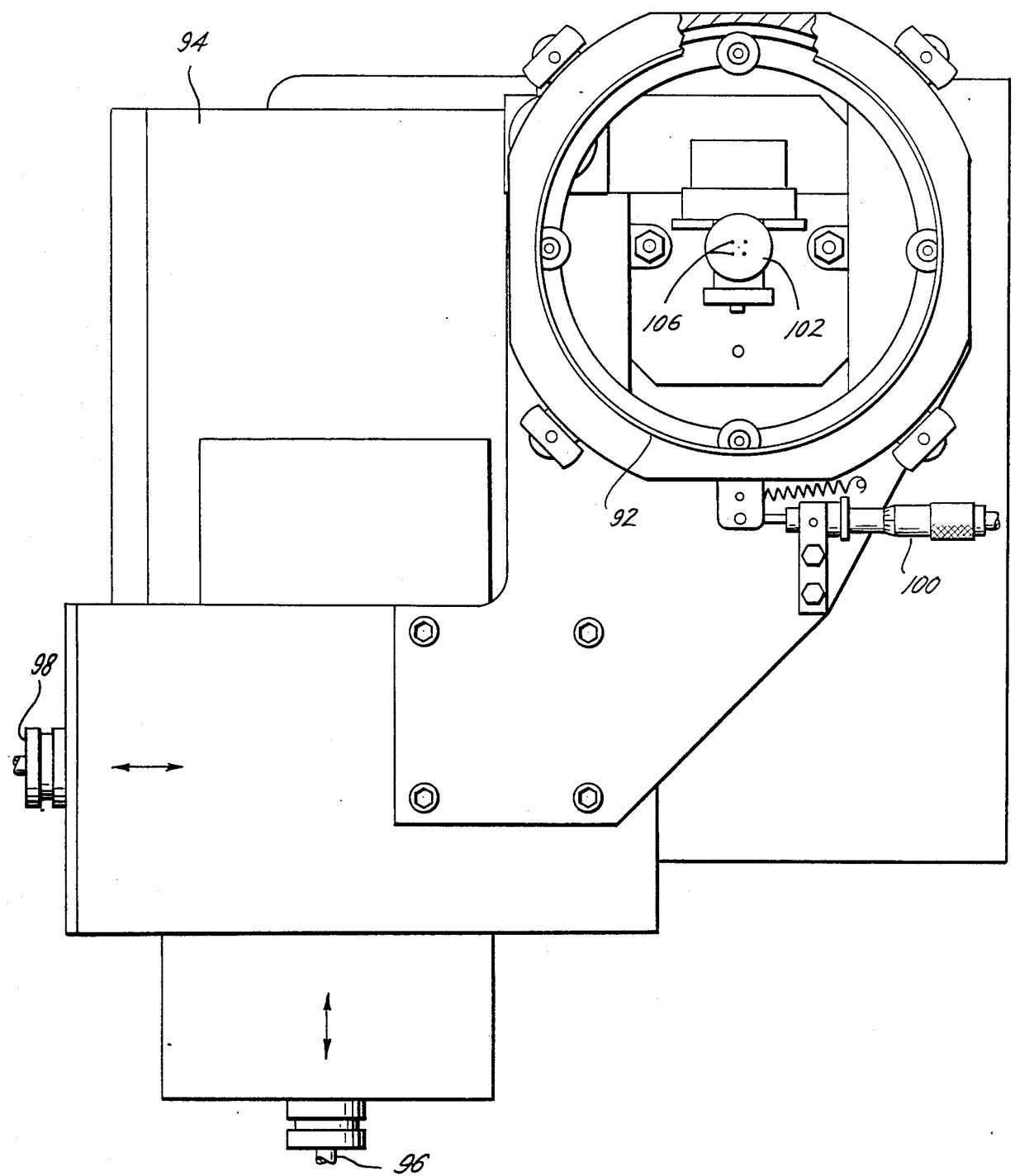
FIG. 12 is a cross-sectional view taken along the line 12—12 of FIG. 11.

Another more automatic system is shown in FIGS. 11 and 12 generally by the reference numeral 80. In this case, the tape 10 is supported by rollers 82 from a support 84 which is movable upwardly and downwardly and the tape 10 is movable horizontally as well. Preferably, the laser system includes the coaxially air nozzle 50 shown in FIG. 9.

Figure 13:
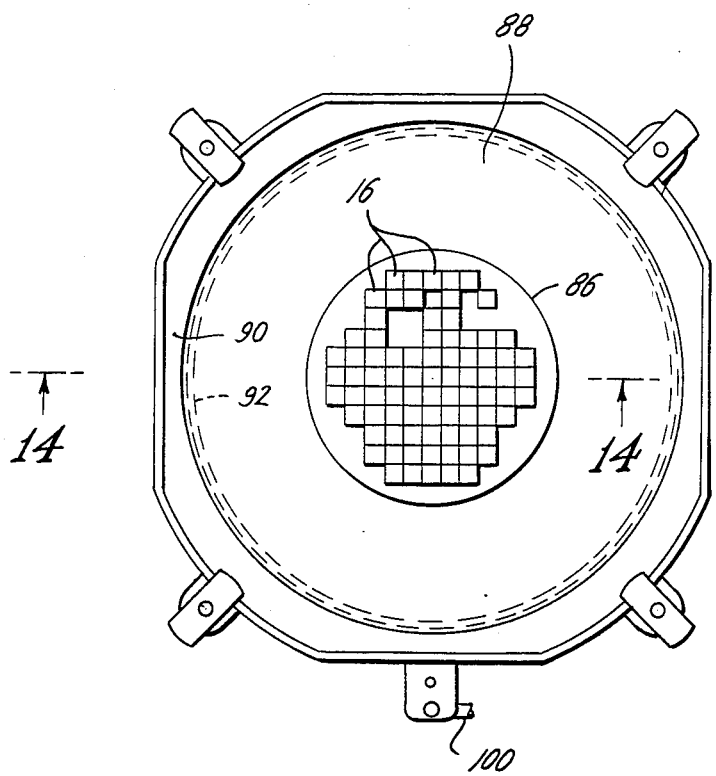
FIG. 13 is a cross-sectional view taken along the line 13—13 of FIG. 11.

As best seen in FIGS. 11, 12 and 13, a silicon wafer generally indicated by the reference numeral 86 is supported on a resilient material 88 such as Nitto tape which in turn is supported from a metal ring 90 and a stretch ring 92. The silicon wafer 86, while on position on the resilient material 88, has been conventional cut to form a plurality of integrated circuit dies 16. The rings 90 and 92 are supported on a support 94 having a control 96 for moving the dies in the X direction, control 98 for moving the dies 16 in the Y direction, a control 100 for moving the dies in a rotational or theta direction and a control 102 for moving a single die in the Z direction.

Figure 14:
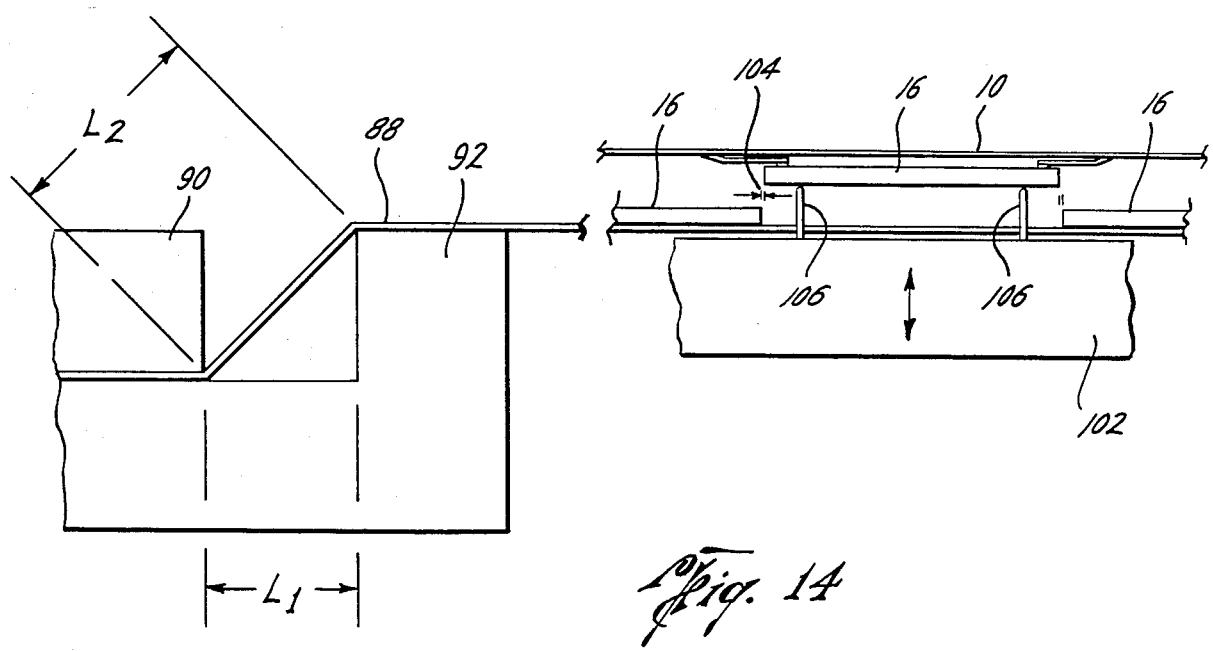
FIG. 14 is a cross-sectional view taken along the line 14—14 of FIG. 13.

While the silicon wafer 86 has been cut into a plurality of integrated circuit dies 16 as is conventional, it is desirable to separate the cut dies 16 a small distance apart from each other for ease of handling. Initially, the wafer 86 is placed upon the resilient material 88 which has been secured to the metal ring 90, at which time it is then sawn to form the individual dies 16. Thereafter, as best seen in FIG. 14, the stretching ring 92 is mated with the ring 90 to radially stretch the resilient material 88, radially outward towards the circular ring 92, which separates the adjacent edges of each die 16 a small amount 104.

In operation, the apparatus 80 of FIGS. 11-14 is operated by moving the tape 10 horizontally by the rollers 82 and then moving the structure 84 downwardly to bring the tape 10 down on a die 16. The controls 96, 98 and 100 are operated to align the bumps 18 of a particular die 16 with the leads 14 at a particular location on the tape 10. Gas, such as nitrogen, is injected through the inlet port 52 and out the nozzle 50 to hold the leads 52 into a pressurized contact with the bumps 18. The laser beam 56 is actuated to sequentially bond each of the leads 14 to each of the bumps 18 on the aligned die 16 while the die is positioned on the resilient material 88. The die vertical moving support 102 is then raised in which four pins 106 (FIG. 14) project through the material 88 for raising the now bonded die 16. At the same time the tape 10 is raised by the support 84 and moves horizontally carrying the now bonded die off. The tape 10 is again moved horizontally and vertically over another unbonded die 16 and the process is repeated.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, and steps of the process, will be readily apparent to those skilled in the art and which are encompassed within the spirit of the invention, and the scope of the appended claims.

What is claimed is:

1. A method of bonding a plurality of electrical leads of a TAB tape to a plurality of electrical bumps on an integrated circuit die by a laser comprising, providing the electrical leads with a coating that has the property of being coupled to the wavelength of the laser and which has a lower melting point than the melting point of the lead and the bumps, aligning the bumps and leads with each other with the tape positioned above the integrated circuit die, holding each of the leads in contact with one of the electrical bumps to form an interface, and bonding the leads and the bumps together at the interface with a laser.

2. A method of bonding the electrical leads of a TAB tape to electrical bumps on an integrated circuit die by a laser comprising, providing the electrical leads with a coating that has the property of being coupled to the wavelength of the laser and which has a lower melting point than the melting point of the lead and the bumps, aligning the bumps and leads with each other with the tape positioned above the integrated circuit die, holding each of the leads in contact with one of the electrical bumps to form an interface, bonding the leads and the bumps together at the interface with a laser, moving the tape horizontally across the integrated circuit die and moving the integrated circuit die vertically for aligning the bumps and leads, holding the leads in contact with the bumps by a gas stream, after bonding, the tape and attached integrated circuit is raised and moved horizontally, and the cycle is repeated with another integrated circuit die.

3. A method of bonding the electrical leads of a TAB tape to electrical bumps on an integrated circuit die by a laser comprising, providing the electrical leads with a coating that has the property of being coupled to the wavelength of the laser and which has a lower melting point than the melting point of the lead and the bumps, aligning the bumps and leads with each other with the tape positioned above the integrated circuit die, holding each of the leads in contact with one of the electrical bumps to form an interface, bonding the leads and the bumps together at the interface with a laser, positioning a silicon wafer on a resilient support, cutting the wafer into a plurality of integrated circuits, positioning the support and cut integrated circuits beneath the tape, stretching the support separating the integrated circuits from each other, and sequential bonding the integrated circuits to the tape by a laser while positioned on the support.

4. The method of claim 3 including, moving the support for sequentially aligning each of the individual integrated circuits with the tape.

5. A laser bonder for bonding two electrical members together comprising, a laser providing a laser beam for bonding the electrical members, and gas means for providing a stream of gas for holding the members in contact with each other while bonding with the laser.

6. The apparatus of claim 5 wherein the gas means is a nitrogen stream.

7. The apparatus of claim 6 wherein the stream of gas is directed coaxial with the laser beam.

8. An automatic bonder for bonding the flat electrical leads of a TAB tape to electrical bumps on a plurality of integrated circuit dies comprising, a laser providing a laser beam for bonding the leads to the bumps, means for moving the tape transversely to the laser beam, means holding a plurality of integrated circuit dies adjacent and below the tape, means for moving a die and the tape towards each other, means for aligning the leads on the tape with the bumps on said die, and means for directing a gas stream coaxially with the laser beam against the leads for holding the leads in contact with the aligned bumps.

9. An automatic bonder for bonding the electrical leads of a TAB tape to electrical bumps on a plurality of integrated circuit dies comprising, a laser providing a laser beam for bonding the leads to the bumps, means for moving the tape transversely to the laser beam, a silicon wafer positioned on a resilient support on which the wafer has been cut to form a plurality of dies, said support holding the plurality of dies adjacent and below the tape, means stretching the support for separating the integrated circuit dies from each other for ease of handling the individual dies, means for moving the support and the tape towards each other, means for aligning the leads on the tape with the bumps on one of said dies for bonding the leads to the bumps while the die is positioned on the support.

* * * * *